United States Patent [19]

Warner

[11] 4,090,125

[45] May 16, 1978

[54] IGNITION INDICATOR FOR INTERNAL COMBUSTION ENGINES

[75] Inventor: Ralph Selden Warner, Columbus, Miss.

[73] Assignee: AMBAC Industries, Incorporated, Carle Place, N.Y.

[21] Appl. No.: 770,296

[22] Filed: Feb. 22, 1977

[51] Int. Cl.² ...................... G01R 13/42; G01R 23/00

[52] U.S. Cl. ........................................ 324/15; 315/57; 324/19

[58] Field of Search .................... 324/15, 17, 18, 16 R, 324/16 S, 16 T, 19; 123/143 C, 148 A, 148 P; 315/57, 70, 85, 129, 131, 276

[56] References Cited

U.S. PATENT DOCUMENTS

| | | | |
|---|---|---|---|
| 2,181,149 | 11/1939 | Peters et al. | 175/183 |
| 2,245,604 | 4/1940 | Peters et al. | 175/183 |
| 3,311,783 | 3/1967 | Gibbs et al. | 315/226 |
| 3,369,175 | 2/1968 | Morris | 324/17 |

*Primary Examiner*—Alfred E. Smith
*Assistant Examiner*—Robert E. Wise
*Attorney, Agent, or Firm*—Dann, Dorfman, Herrell and Skillman

[57] ABSTRACT

In an ignition indicator system for internal combustion engines, a transformer is interposed in each line between the spark plug and distributor or other timing circuit. The transformer has a sensor element positioned adjacent thereto to be indirectly coupled to the transformer output circuit. Terminal means is provided for connecting the sensor element to detector means which permits analysis of the pulses for firing the spark plug. Preferably, the transformer and the high voltage portion of the ignition system is shielded by a grounded casing or sheath to minimize radiation of signals, as well as to confine any explosion of ignited gases within the casing or sheath. Access to the sensor element does not adversely affect the shielding effect of transformer casing.

11 Claims, 4 Drawing Figures

IGNITION INDICATOR FOR INTERNAL COMBUSTION ENGINES

The present invention relates to an improved diagnostic indicator system for monitoring the pulses produced to fire the spark plugs during operation of internal combustion engines, in which the pulses to fire the spark plugs are received from a high-voltage transformer in the ignition circuit. The present invention is particularly adapted for use in shielded ignition systems wherein each spark plug has a separate transformer associated therewith and the indicator system includes a sensor element mounted with the transformer.

High-voltage transformers are used in ignition system circuits for heavy-duty engines and are positioned in the circuit intermediate the electrical generating means and the spark plugs so that the ignition system may utilize an electrical generating means which generates a relatively low voltage pulse or signal that is increased in potential by the transformer to a sufficiently high voltage pulse to fire the spark plug. In this arrangement, which is termed a low tension system, the electrical generating means is located at some distance from the cylinders and spark plugs. The stepped-up signal at the transformer produces radio-frequency signals which may be effectively confined by grounded shielding surrounding the transformer and its connections to the spark plug and to the electrical generating means. Such systems with shielding means are particularly adapted for use in offshore drilling rigs, airplanes and other applications where radio-frequency signals may interfere with radio communications, firing control of explosives or other instances where the high voltage of the pulse might cause an arc that would ignite any combustible atmosphere in the area.

Diagnostic instruments are available for use in automotive diagnostic centers and in service centers which are equipped to test the ignition circuit of conventional automobiles by capacitive coupling to the lead wires connected to the spark plugs. In such conventional automotive use, the lead wires carry a sufficiently high voltage to generate a signal which may be capacitively coupled to the diagnostic instrument for the purposes of the testing. However, in heavy-duty engine applications, where high-voltage transformers are interposed in the leads to the spark plugs, the conductors from the secondary of the high-voltage transformer are normally inaccessible. Thus, the standard diagnostic instruments cannot be used to sense the pulses from the secondary to the spark plug. This is particularly true where shielded ignition systems are employed in which all of the circuit leads are encased in grounded sheaths. In large engine installations where a continuous diagnosis of ignition pulses of a shielded ignition system is desired, a permanent interconnection with a high voltage circuit conductor may be provided which permits sensing of the pulses emitted by special access openings formed in the sheath of the circuit conductor. Such access is adequate to enable sensing of the ingnition pulses, but when the diagnosis is not being performed, disconnection of the sensing instruments may permit escape of radio-frequency signals from the circuit and may leave an opening in the pressure-tight shielded enclosure. Such access openings in shielding for electrical conductors of an ignition system are shown in the prior U.S. patents to Peters et al., U.S. Pat. Nos. 2,181,149 and 2,245,604. Furthermore, in systems where the transformer is mounted directly on the spark plug to minimize the length of high voltage conductors, such systems do not facilitate the use of such conductor access openings to monitor the signal between the transformer and spark plug.

In accordance with the present invention a diagnostic connection for the ignition circuit is provided which does not require interruption of the shielding of the ignition system and yet enables selective sensing of the pulses generated by the secondary circuit of the high-voltage transformer during engine operation without affecting the shielding between the high-voltage transformer and the spark plug.

More specifically, the present invention provides a means for sensing the pulses generated by the secondary circuit of the high-voltage transformer connected with the individual voltage supplies for each spark plug.

In particular, the present invention provides a novel shielded transformer having within the shield an integral sensor in the form of a sensing conductor or element which is indirectly coupled to the transformer and particularly the output or the secondary circuit of the transformer, the sensor being accessible exteriorly of the shielded transformer for either permanent or temporary connection to detector or indicating means for giving a visual or audible signal of the functioning of the ignition system.

The present invention preferably provides a transformer embodying a sensor conductor of the type in which the external terminal of the sensor is disposed within a shielded recess to avoid secondary radiation of radio-frequency signals, whereby when said detector cirucit is disconnected from the sensor terminal, the shielded effect is not disrupted.

The present invention is applicable to high-voltage transformers which are coupled directly to the spark plug, as well as to transformers which are mounted remote from the spark plug and are connected thereto by a length of shielded electrical conduit.

With the foregoing in mind, the features and advantages of the present invention are set forth more fully hereinafter with reference to the accompanying drawings, wherein.

Figure 1:
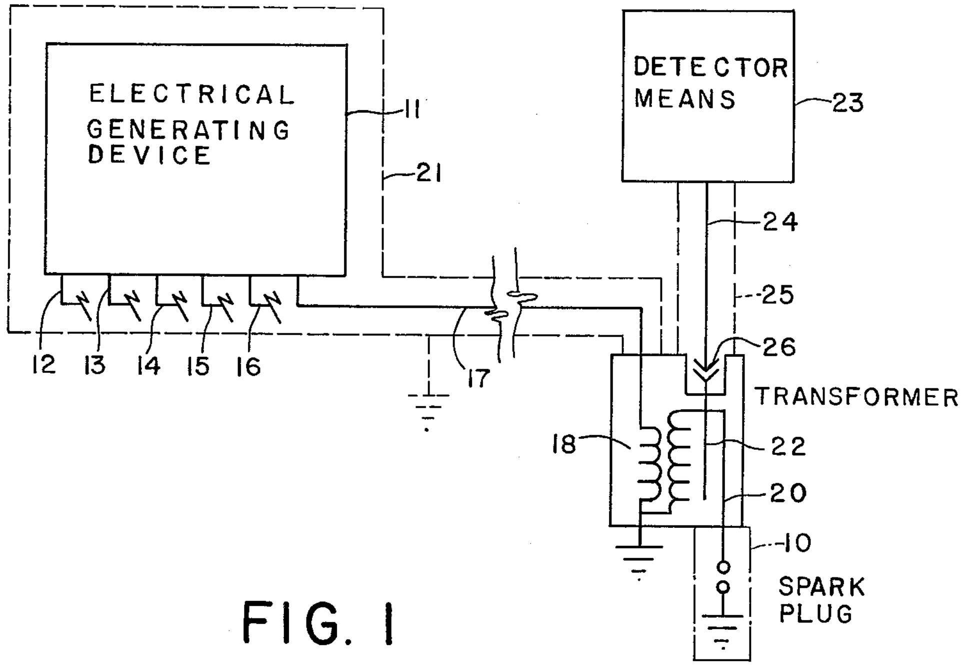
FIG. 1 is a schematic diagram of an ignition system in use with the present invention.

Referring now to the drawings, there is illlustrated in FIG. 1 an overall ignition system embodying the present invention. The ignition system is used in conjunction with an engine (not shown), which may be a conventional internal combustion engine, having at least one cylinder with at least one spark plug for each cylinder of the engine for igniting combustible fuel in the associated cylinder. Timed firing of the fuel in each of the cylinders is provided by an electrical generating device generally designated 11 which in the present instance has six outputs 12, 13, 14, 15, 16, and 17, each adapted to be connected to a spark plug, output 17 being shown connected to a spark plug 10. More specifically, the ignition system further includes a voltage step-up transformer 18 of a high-frequency type having its primary connected to output conductor or connecting means 17 of the electrical generating device and its secondary connected in a circuit including the plug 10 by connecting means or conductor 20. The electrical generating device 11 may be provided by any of the conventional electrical generating means or devices for generating a plurality of pulses in synchronism with engine operation at output conductors 12 to 17, to which are adapted to be connected to associated transformers, such as transformer 18, to fire the associated spark plugs. The electrical generating means or device 11 may consist of a pulse generator or a conventional magneto-type ignition system employing breaker points or electronic circuits to replace the breaker points, to produce the timed pulses in synchronism with engine operation. The number of outputs from the electrical generating device may vary and a distributor or electronic circuit with switches may be employed in a conventional manner to provide the proper timing of pulses at the outputs. The pulses of the electrical generating device are preferably of a low voltage to minimize arcing, sparking and other undesired radiation during operation of the engine. As indicated in FIG. 1, the electrical generating device and its connecting means or conductors are shielded, as indicated at 21, as may be required in various applications of ignition systems. The shielding 21 may be provided by a casing around the electrical generating device and shielding cable around the output lines, such as line 17. The transformer and its connection to the spark plug are also shielded as will be explained more fully hereinafter.

In accordance with the present invention, means is provided in the transformer 18 for diagnostic testing of the pulses conducted through the transformer, and particularly the testing is performed in association with the secondary circuit of the transformer as indicated in FIG. 1, where an accurate indication of the ignition pulse to fire the spark plug is obtained. The access to the secondary circuit of each transformer 18 is designed to avoid direct coupling and the danger of exposure to the high voltage generated in the secondary of the transformer in the ignition circuit. Indirect coupling provides a transfer of electrical energy without any direct mechanical interconnection between the secondary circuit and the testing circuit. In the present instance, the indirect coupling is by means of a sensor element in the form of a rod 22 disposed adjacent the secondary output circuit of the transformer 18. In the present case, the indirect coupling is obtained by capacitive coupling between the sensor rod 22 and an output conductor of the transformer. By using an inductive sensor loop or coil, indirect inductive coupling may be obtained between the secondary circuit and the sensor loop or coil. Indirect coupling between the secondary and the rod provides for a generation of a signal in the rod when an ignition pulse is applied to the primary of the transformer 18 to create a pulse in the secondary circuit.

The character of signal generated in the rod by the pulse in the secondary is dependent upon the condition of the spark plug and the character of the signal may be detected by suitable detector means 23 coupled to the detector or sensor rod 22, for example by a lead 24. The detector means provides an indication of the character of the signal generated in the sensing element. The lead 24 may be shielded, as indicated at 25. The level of energy transferred to the rod 22 is sufficiently low to be safe and does not detract from the pulse of energy supplied to the spark plug in normal operation. When the spark plug functions normally, as required by engine operation, the detector means senses the normal signal generated by the ignition pulse in the secondary of the transformer 18. Thus, the characteristic of the signal in the secondary circuit sensed by the rod 22 is indicative of the condition of the plug 10 to which the transformer 18 is connected. The signal pick-up arrangement of the present invention permits analysis of the operation of the secondary circuit by observing the signals which it reflects. If the spark plug gap breaks down, the energy stored in the winding and the secondary lead discharges abruptly, giving a high frequency oscillation in the secondary circuit sensed by the sensor rod. If the spark plug does not break down, any oscillations present are much lower in frequency and the sensed signal is substantially reduced.

Figure 3:
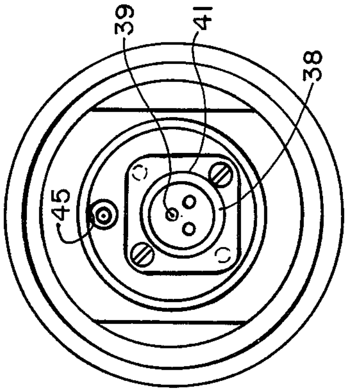
FIG. 3 is an end view of the structure shown in FIG. 2.
Figure 2:
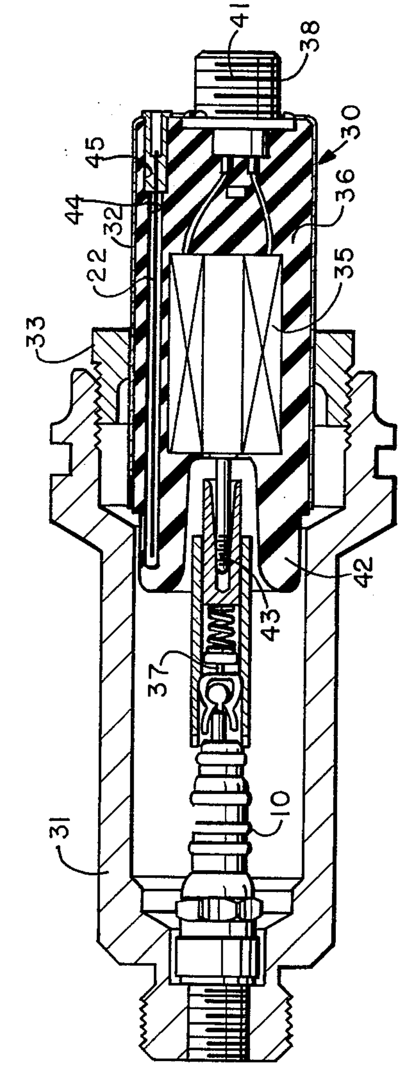
FIG. 2 is a sectional view illustrating a spark plug to be mounted in an engine head and having a transformer mounted thereon in accordance with the present invention.

A preferred embodiment of transformer assembly is generally designated 30 in FIG. 2, wherein the transformer is coupled directly to the spark plug 10 by means of an elongated secondary conductor 43 and a connector generally designated 37, which together from the connecting means or connection 20 schematically illustrated in FIG. 1. The spark plug 10 is mounted in a suitable adapter casing 31, which is mounted in the engine block and serves as a grounded shield for the spark plug and transformer connection. The adapter casing is tubular in form to provide a shielded housing for the spark plug 10. The transformer coils of the assembly 30 are mounted within a tubular shell 32 having threads adjacent its inner end at 33, which are adapted to be threadedly engaged with the adapter casing 31. The tubular shell 32 provides a metallic shield surrounding the components of the transformer 35 so as to confine any radiated energy or any pressure or flame caused by ignition of gases within the shield. The transformer coils are wound together as a compact package as indicated at 35 and are firmly anchored in the shell 32 by a surrounding body of insulating material designated 36. The forward end of the body of material is formed as a nose 42 to completely surround the output conductor 43 in a fashion to permit engagement of the conductor 43 with the connector 37 which in turn contacts the spark plug 10 within the adapter housing 31. In the present instance, the connector 37 assures direct electrical connection between the high voltage secondary of the transformer 35 and the spark plug 1o. At the end of the transformer assembly 30 remote from the spark plug, the metallic shell 32 is povided with a plug assembly 38 which, as shown in FIG. 3, has prongs 39 to which the connecting line 17 in FIG. 1 from the electrical generating device may be coupled. The plug assembly 38 includes a threaded member 41 which serves as a connector for the shielding cable 21 around the connecting line 17. Thus, the threaded member 41, the shell 32, and the shielding cable 21 effectively confine any radiation from the transformer 35.

To the extent described above, the high voltage transformer assembly is of conventional construction. In accordance with the present invention, the transformer structure is modified to include the sensor rod 22 as illustrated schematically in FIG. 1. To this end, in FIG. 2 the body of insulating material 36 has sensor rod 22 mounted therein. In the present instance, the rod is mounted in a Teflon sleeve 44 extending within and along the length of the tubular shell or casing 32 substantially parallel to the axial dimension of the transformer and the output conductor 43. At the rear end of the transformer assembly, the terminal end of the sensor rod is mounted in a receptacle or socket 45, preferably formed of a hard wear-resistant insulating material.

The receptacle provides access to the exposed terminal end of the sensor rod 22, so as to permit a releasable connection thereto of the lead 24 of FIG. 1, the terminal end of the sensor rod and lead 24 providing terminal means to connect the sensor rod to the detector means 23. The receptacle with the exposed end of the rod therein constitutes a female plug for the lead 24 and the construction is such that the rod 22 terminates at the bottom of the receptacle a sufficient distance so as to avoid extraneous radiation from the end of the rod. The receptacle is embedded within the insulating body of material 36 a sufficient distance from the rear end of the tubular casing 32 to avoid loss of the shielding effects. When disconnected from the detector means 23 and lead 24, the exposed end of the rod 22 also provides a convenient means for checking the timing of the ignition system to the engine while it is running.

The position of the rod 22 alongside the transformer assembly 35 permits indirect coupling of the rod to the secondary circuit of the transformer, and the signals picked up by the rod through the indirect coupling may be transmitted to the detector means 23, as by lead 24. The indirect coupling enables energy to be picked up by the rod, but the level of energy is sufficiently low to be safe and does not detract noticeably from the available ignition energy. The degree of coupling may be increased, for example, by reducing the spacing between the rod 22 and the secondary output conductor 43 of the transformer or by extending or curving the rod circumferentially round the output conductor 43. Since the signal generated in the secondary circuit is a high frequency signal, the indirect coupling is effective to impart sufficient energy to actuate desired detector means.

The detecting means 23 may be provided by a number of different arrangements, including a simple neon glow lamp having one terminal connected to the rod 22 and the other grounded, so that its flash will indicate the firing of the spark plug. Other arrangements include a timing light, a spark detector, a cathode ray oscilliscope for a detailed analysis operation of the ignition signal, or other electronic circuitry for continuous monitoring or providing a warning of a spark plug not firing. The detector arrangement may be connected permanently to all of the transformers in the ignition circuit to provide continuous monitoring of the firing of the plugs, or may be connected temporarily to provide sequential monitoring of the respective plugs. The selection of the detector means determines the type of indication provided, and the present invention permits a wide selection of operable devices.

The receptacle of socket 45 of this embodiment of the invention is particularly adpated to a plug-in connection to the detector means but a permanent connector may be used, if desired. Where the ignition system is designed for permanent connection to the detector, the plug assembly 38 may be modified to accommodate an additional connection for the detector circuitry, so as to permit continuous diagnostic analysis of the functioning of the ignition circuit and pulses.

Figure 4:
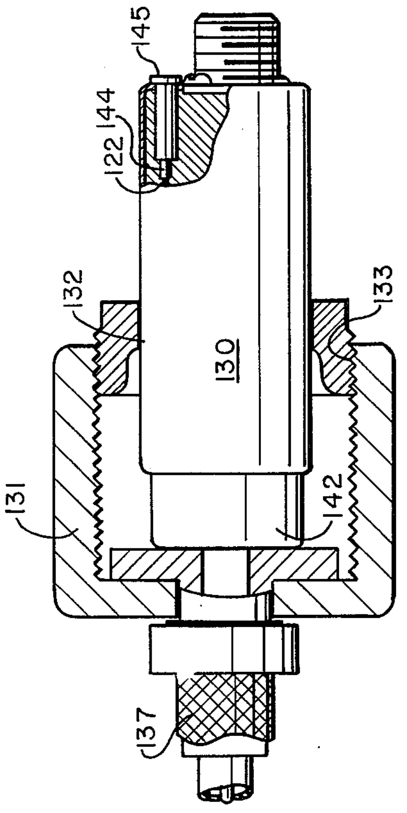
FIG. 4 is a view similar to FIG. 2 illustrating a transformer remote from the spark plug and showing a conduit for connecting the secondary of the transformer to the spark plug.

In installations where the spark plugs are not readily accessible, the present invention may be used by disposing the high-voltage transformer in its shielded casing at a position remote from the spark plug and connected intermediate the electrical generating device and spark plug by shielded leads. To this end, an arrangement such as shown in FIG. 4 may be employed, wherein the spark plug is connected to the high-voltage transformer assembly 130 by a length of shielded conduit or lead 137. In the present instance, the transformer assembly 130 is substantially identical to the transformer assembly 30 described in regard to FIG. 2, and the shielded connecting means or line 137 is operable to effect an electrical connection at one end with the output conductor (not seen) of the transformer assembly 130 and at the other end to the spark plug (not shown). In the embodiment of FIG. 4, the shielded conduit has a fitting 131 which engages threads 133 on the exterior of tubular shell 132 of the assembly, and the transformer assembly has an internal configuration with a secondary output conductor within a nose 142 of insulating material, as described in regard to FIG. 2. A sensor rod 122 is mounted in an insulating sleeve 144 with a terminal end engageable in a receptacle or socket 145 all of which function indentically to the corresponding elements of FIGS. 2 and 3.

The present invention provides an ignition indicator system with a transformer assembly in which a sensor element is incorporated into the high-voltage transformer assembly so as to permit diagnostic tests of the functioning of the spark plugs without substantially affecting the operation of the engine, as might occur if the tests should involve an interruption of the ignition circuitry or as an addition of direct connections to the circuitry, which are particular problems with shielded ignition systems with which the present invention is primarily concerned. The present invention provides the capability for either continuous or intermittent monitoring of the ignition signal.

While the invention has been illustrated and described in conjunction with a particular form of transformer and spark plug, it is apparent that the particular configuration of the transformer and spark plug is not critical. Elements of other configurations may be used and other changes and modifications may be incorporated in the ignition systems without departing from the scope and spirit of the present invention as defined by the appended claims.

I claim:

1. An ignition indicator system for an internal combustion engine having at least one spark plug for each cylinder and electrical generating means for generating pulses in synchronism with operation of the engine, the ignition indicator system comprising:

connecting means for providing a connection from said spark plug to said electrical generating means including a transformer having a primary circuit connected to said generating means and a secondary circuit including the spark plug;

a sensor element mounted with said transformer for having indirect coupling between the secondary circuit of said transformer and said sensor element to generate signals in said sensor element in response to pulses applied to said transformer, and terminal means to connect said sensor element to detector means for providing an indication of the operation of said secondary circuit.

2. The system according to claim 1 including a grounded shielding means surrounding at least said plug, said transformer and the connecting means between said plug and transformer, said sensor element being mounted within said shielding means and having an exposed end which is accessible through said shielding means for enabling said terminal means to connect said sensor element to said detector means without disrupting said shielding means.

3. The system according to claim 1 wherein said transformer and sensor element are disposed within an elongated tubular shielding casing, one of said casing having connection means to be connected to said spark plug, the other end of said casing having connection means to be connected to said electrical generating means, said sensor means having an exposed end accessible through said shielding casing.

4. The system according to claim 3 including a grounded shielding means for said connection means at said one end, and for said connection means between said transformer and said electrical generating means.

5. The system according to claim 1 wherein said transformer comprises a tubular casing, said primary and secondary being mounted within said casing in spaced relation to said casing, said sensor element comprising a rod extending longitudinally within said casing spaced from said transformer, and said tubular casing having a body of insulating material within said casing surrounding said rod and said primary and secondary to provide a firmly supported and integral structure.

6. The system according to claim 5 including a socket mounted in said body of insulating material at one end of said tubular casing said rod terminating within said socket to permit connection to said detector means.

7. The system according to claim 1 including an adapter structure for mounting said spark plug to the engine, said adapter structure having a hollow cylindrical casing surrounding said spark plug and having threaded means providing a shielded connector therefor, said transformer being fixedly supported in said adaptor structure in fixed position relative to said plug, and a connection between said plug and said transformer secondary comprising a connector to provide a direct electrical interconnection.

8. For use in an ignition system for an internal combustion engine having at least one spark plug for each cylinder, electrical generating means for generating a series of pulses, and connecting means for connecting said spark plug to said electrical generating means;

a transformer having a primary for connecting to said generating means and a secondary circuit for connecting to said spark plug, a sensor element mounted with said transformer for having indirect coupling between said transformer secondary circuit and said sensor element to generate a signal in said sensor element in response to pulses applied to said transformer, and terminal means to connect said sensor element to detector means to provide an indication of said pulses.

9. A transformer according to claim 8 wherein said primary and secondary are wound together in an assembly, said transformer including a body of insulating material surrounding said primary and secondary, and a tubular casing surrounding said insulating material, said sensor element being disposed within said casing exteriorly of said assembly, said terminal means of said sensor element being mounted to be accessible from outside said tubular casing.

10. A transformer according to claim 9 wherein said terminal means of said sensor element comprises a socket in said casing, said sensor element comprising a rod having an exposed terminal end in said socket.

11. A transformer according to claim 9 wherein said transformer has an elongated secondary output conductor and said sensor element is mounted in said casing adjacent to said secondary output conductor of said transformer for indirect coupling therewith to provide a signal responsive to operation of said secondary circuit.

* * * * *